United States Patent [19]

Daughters

[11] Patent Number: 5,028,892
[45] Date of Patent: Jul. 2, 1991

[54] ANALOG PHASE SHIFTER

[75] Inventor: Timothy E. Daughters, Methuen, Mass.

[73] Assignee: AT&T Bell Laboratories, Murray Hill, N.J.

[21] Appl. No.: 516,391

[22] Filed: Apr. 30, 1990

[51] Int. Cl.⁵ .................... H01P 1/185; H03H 7/20
[52] U.S. Cl. ................................. 333/164; 333/138
[58] Field of Search ............... 333/138, 140, 161, 160, 333/164, 117, 118, 120

[56] References Cited

U.S. PATENT DOCUMENTS 4,638,269  1/1987  Dawson et al. .................. 333/164
4,859,972  8/1989  Franke et al. .................... 333/164

FOREIGN PATENT DOCUMENTS 0144403  6/1987  Japan ................................. 333/164

OTHER PUBLICATIONS

Gupta et al., "Quasi-Lumped-Element 3 and 4 Port Networks for MIC and MMIC Applications", 1984, IEEE MTT-S Digest, pp. 409-411.

Primary Examiner—Eugene R. LaRoche
Assistant Examiner—Seung Ham
Attorney, Agent, or Firm—Eli Weiss

[57] ABSTRACT

An analog voltage-controlled phase shifter is disclosed which is smaller in size and provides a larger phase shift for a smaller change of capacitance of presently available voltage controlled phase shifters. These unexpected advantages are obtained by using lumped elements to simulate the normally used λ/4 transmission lines of the hybrid portion of the phase shifter and by eliminating or reducing the value of the capacitors normally present at the varactor nodes of the hybrid. The capacitance fully or partially removed from the varactor nodes of the hybrid can be selectively fully or partially added to the varactors.

8 Claims, 3 Drawing Sheets

ANALOG PHASE SHIFTER

TECHNICAL FIELD

This invention relates generally to analog voltage-controlled phase shifters and, more particularly, to an analog voltage controlled phase shifter which has improved phase-shift characteristics.

BACKGROUND OF THE INVENTION

One use of an analog voltage-controlled phase shifter is to align the phase of a narrow-band signal such as a recovered clock signal with the incoming data stream such that decisions are made at the proper times. Another use is to phase modulate a carrier signal. There are many other uses and applications for analog phase shifters as they can be used at many different frequencies.

In one application, the phase shifter currently in use in lightwave regenerators requires a branch-line quadrature hybrid in combination with gallium arsenide hyperabrupt varactor diodes to obtain the required range of phase shift. These diodes have the disadvantages that they are expensive, they are subject to large variations in center capacitance and capacitance slope Vs. voltage, and proper operation of the phase shifter relies on well-matched diodes.

SUMMARY OF THE INVENTION

An analog voltage-controlled phase shifter is disclosed which is smaller in size and provides a larger phase shift for a smaller change of capacitance then presently available voltage controlled phase shifters. These unexpected advantages are obtained by using lumped elements to simulate the normally used quarter wavelength transmission lines of the quadrature hybrid portion of the phase shifter and by eliminating or reducing the value of the capacitors normally present at the varactor nodes of the quadrature hybrid. The capacitance fully or partially removed from the varactor nodes of the quadrature hybrid can be selectively added either fully or partially to the varactors.

BRIEF DESCRIPTION OF THE DRAWING

A more complete understanding of the invention can be obtained by reading the following description of a specific illustrative embodiment of the invention in conjunction with the appended drawings in which.

DETAILED DESCRIPTION

Figure 1:
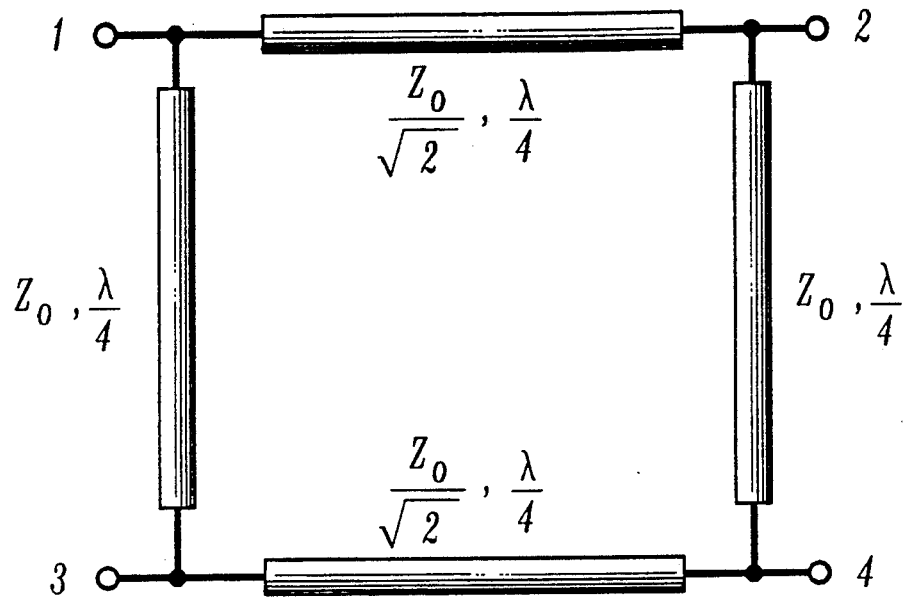
FIG. 1 is a schematic of a quadrature hybrid.

Referring to FIG. 1, there is illustrated prior art structure for realizing a quadrature hybrid which, when coupled to identical variable reactances such as, for example, varactor diodes at ports 2 and 3 forms an analog phase shifter. At microwave frequencies, the quadrature hybrid can be realized by using four quarter-wavelength transmission lines.

At the frequency where the transmission lines are a quarter-wavelength long, the scattering matrix of the quadrature hybrid when referenced to $Z_o$ (the input and output impedance) is:

$$\begin{bmatrix} b_1 \\ b_2 \\ b_3 \\ b_4 \end{bmatrix} = \frac{1}{\sqrt{2}} \begin{bmatrix} 0 & -j & -1 & 0 \\ -j & 0 & 0 & -1 \\ -1 & 0 & 0 & -j \\ 0 & -1 & -j & 0 \end{bmatrix} \begin{bmatrix} a_1 \\ a_2 \\ a_3 \\ a_4 \end{bmatrix}$$

where $a_n$ represents the amplitudes of the waves incident on ports 1, 2, 3 and 4 and $b_n$ represents the amplitudes of the waves emerging from ports 1, 2, 3 and 4. If ports 2 and 3 are terminated with reactances having reflection coefficients of $\Gamma_2$ and $\Gamma_3$ then $$a_2 = \Gamma_2 b_2;$$

and $$a_3 = \Gamma_3 b_3.$$

The matrix equation becomes $$b_1 = \frac{1}{\sqrt{2}} (-j\Gamma_2 b_2 - \Gamma_3 b_3)$$

$$b_2 = \frac{1}{\sqrt{2}} (-ja_1 - a_4)$$

$$b_3 = \frac{1}{\sqrt{2}} (-a_1 - ja_4)$$

$$b_4 = \frac{1}{\sqrt{2}} (-\Gamma_2 b_2 - j\Gamma_3 b_3)$$

If it is assumed that there is a matched load of $Z_o$ on port 4 and that port 1 is driven with a unit amplitude signal, then $$a_1 = 1;$$

and $$a_4 = 0.$$

Thus, $$b_2 = \frac{1}{\sqrt{2}} (-j)$$

$$b_3 = \frac{1}{\sqrt{2}} (-1)$$

$$b_1 = \frac{1}{\sqrt{2}} \left[ -j\Gamma_2 \left( \frac{-j}{\sqrt{2}} \right) - \Gamma_3 \left( \frac{-1}{\sqrt{2}} \right) \right]$$

$$= \frac{1}{2} (\Gamma_3 - \Gamma_2)$$

$b_1$ becomes the reflection coefficient of the resulting 2 port.

$$b_4 = \frac{1}{\sqrt{2}}\left[-\Gamma_2\left(\frac{-j}{\sqrt{2}}\right) - j\Gamma_3\left(\frac{-j}{\sqrt{2}}\right)\right]$$

$$= \frac{1}{2}j(\Gamma_3 + \Gamma_2)$$

$b_4$ will become the transmission coefficient of the resulting 2 port.

If $\Gamma_2 = \Gamma_3$, then input reflection coefficient is zero and the transmission coefficient is $j\Gamma$. Therefore, if the magnitude of $\Gamma = 1$ and the argument of $\Gamma$ is variable, a phase shifter is obtained having a matched input and a phase which is controlled by the argument of $\Gamma$.

The above is an explanation of the prior art.

One problem with the prior art phase shifter is that at low frequencies the quarter-wavelength transmission lines are very large. Another problem is that the phase shifter requires a variable reactance with a large tuning range to obtain a large phase shift.

Figure 5:
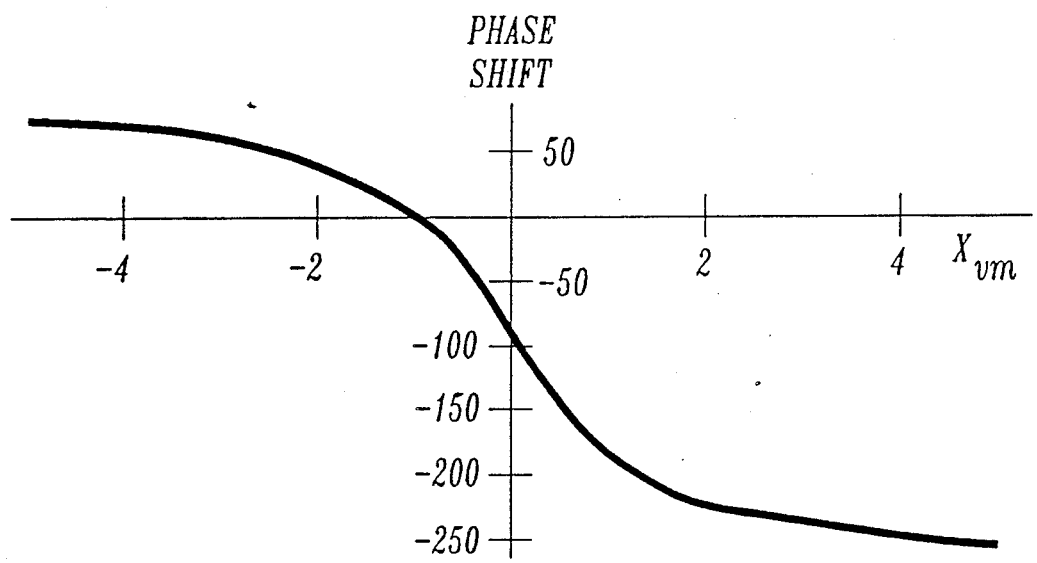
FIG. 5 is a plot of the phase shift angle Vs. the normalized reactance of the series varactor-inductor circuit of a prior art analog phase shifter.

A typical abrupt junction varactor can give a tuning ratio of about 2.5 to 1 from minimum capacitance to capacitance. This also corresponds to a 2.5 to 1 ratio in the resulting capacitive reactance. Referring to FIG. 5, it can be seen that a 2.5 to 1 ratio of capacitive reactance alone could give at most, a range of about 50° in a prior art phase shifter. It is well known that adding a fixed inductance in series with the varactor can significantly increase this range. Consider for instance, a varactor whose reactance (normalized to $Z_0$) can be varied from $-1.4$ to $-3.5$. Add to this a fixed inductor having a normalized reactance of $+2.45$. The range of normalized reactance for the resulting network is from $+1.05$ to $-1.05$. FIG. 5 shows that this network has a phase shift range of about 180°. Similarly, a varactor whose normalized reactance could be tuned over a range from $-3.2$ to $-8$ in series with a fixed inductor with normalized reactance of $+5.6$ could be tuned over a range from $+2.4$ to $-2.4$ giving a phase shift range of 270°.

Using large reactance values as above cause two problems. The first is that at high frequencies, parasitic parallel capacitance in the inductor and the varactor can swamp out the desired reactance of the elements. This effect becomes more severe as the desired reactance is increased. The second problem is that small errors in element values can lead to very errors in the desired reflection coefficient at the two diode ports. Consider the second example above, but assume that one inductor is 5% high in value ($X_{ln} = 5.88$), and the other is 5% low in value ($X_{ln} = 5.32$). Now, tune the varactor to the center of its range ($X_{cn} = -5.6$). The reactances at the two hybrid ports, then, are not equal but are $+0.28$ and $-0.28$. In the equations above, $\Gamma_2 = -0.855 + j0.519$ and $\Gamma_3 = -0.855 - j0.519$. This gives a reflection coefficient of over 0.5 which can be unacceptable.

An alternative to using large inductors and small capacitance varactors (small capacitance = large reactance) is to use hyperabrupt junction varactor diodes. These diodes have a larger tuning range, but are more expensive, and have lower Q factors than their abrupt junction counterparts. At high frequencies, the low Q will often dictate using even more expensive Gallium Arsenide varactors.

Figure 6:
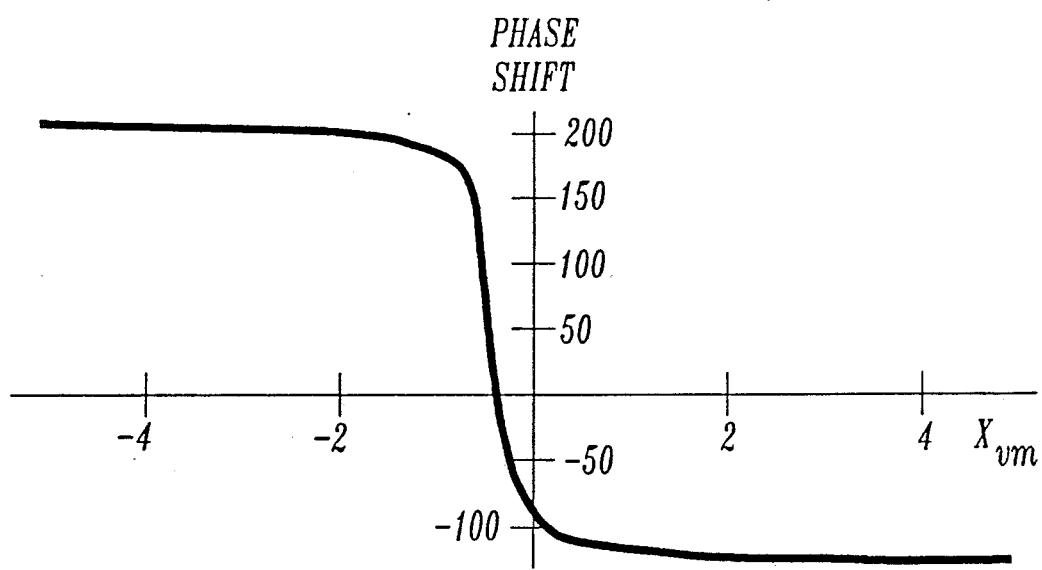
FIG. 6 is a plot of the phase shift angle Vs. the normalized reactance of the series varactor-inductor circuit of the inventive analog phase shifter.

The inventive design can give a large phase shift without the need for large inductors. In FIG. 6, it can be seen that a varactor whose reactance can be tuned from $-0.3$ to $-0.75$ will give a tuning range of 180° without the need for a series inductor. A 270° design comparable to the prior art design above requires $X_{cn}$ to vary from $-0.5$ to $-1.25$ with $X_{ln}$ fixed at 0.42. Hence, the inventive design can use much smaller inductors in series with the varactors for a given range. In some cases the inductors can be eliminated entirely. In addition, the required capacitance for the varactors is larger (smaller reactance) which results in a more practical design.

Using the principles of the invention, phase shifters having a reasonably linear phase shift with applied control voltage can, also, be obtained. Again, the inventive circuit results in more practical element values.

Figure 2:
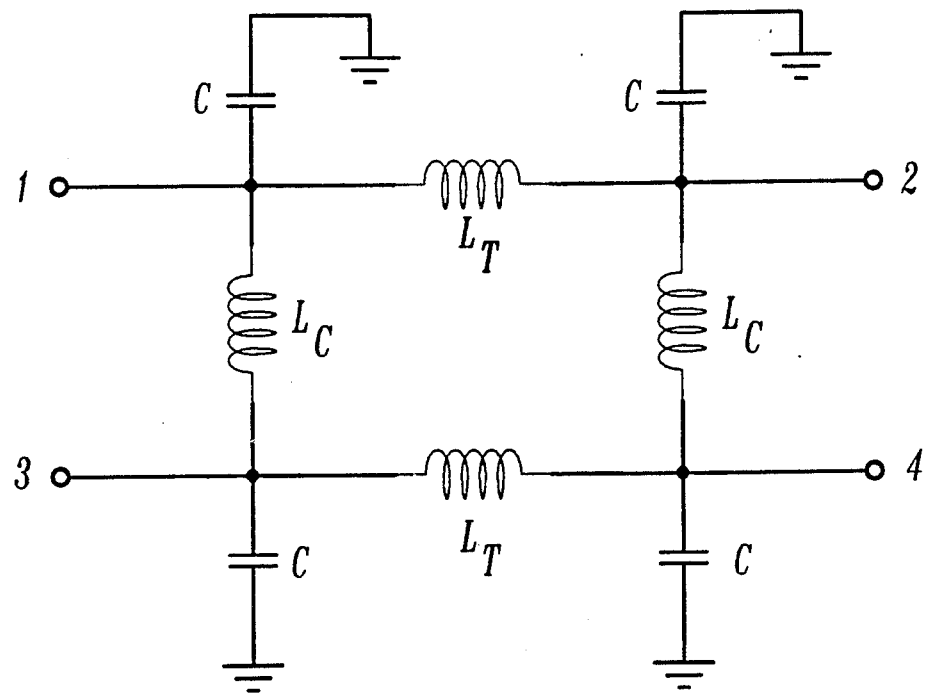
FIG. 2 is a schematic of a prior art quadrature hybrid having lumped elements.

Referring to FIG. 2, there is illustrated a lumped element quadrature-hybrid as described in the paper by R. K. Gupta and W. T. Getsinger entitled "Quasi-lumped element 3- and 4-port Networks for MIC and MMIC Applications" published in 1984 IEEE MTT-S International Microwave Symposium Digest, pp. 409-411,. FIG. 2 can be obtained by substituting the $\pi$ network illustrated in FIG. 3 for the quarter-wavelength transmission lines of FIG. 1. At the desired center frequency $f_o$, the quadrature hybrid networks of FIG. 1 and FIG. 2 are electrically indistinguishable. In FIG. 2, $$L_T = \frac{Z_0/\sqrt{2}}{2\pi f_0};$$

$$L_C = \frac{Z_o}{2\pi f_o}; \text{ and}$$

$$C = \frac{1}{Z_o 2\pi f_o} + \frac{1}{\frac{Z_o}{\sqrt{2}} 2\pi f_o}$$

Figure 3:
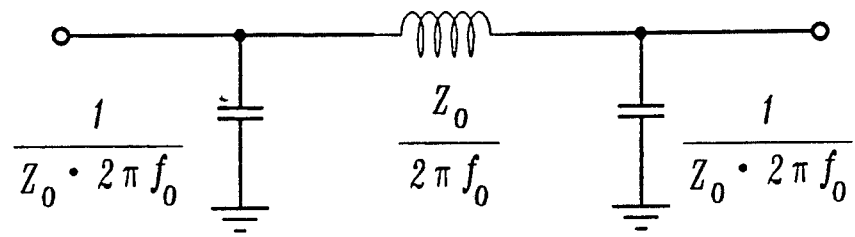
FIG. 3 is a schematic diagram of a $\pi$ network which can be substituted for the transmission line of FIG. 1.
Figure 4:
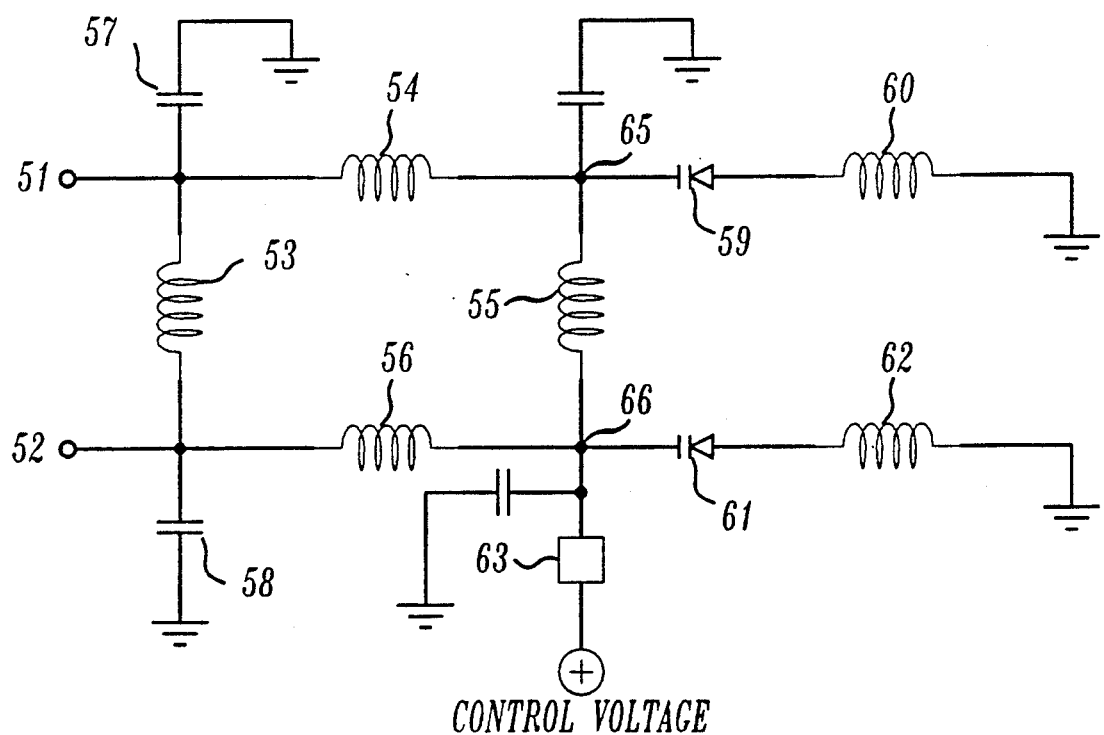
FIG. 4 is a schematic diagram of an analog phase shifter in accordance with the principles of the invention.

Referring to FIG. 4, there is illustrated a schematic diagram of structure in accordance with the principles of the invention. FIG. 4 comprises a quadrature-hybrid network having lumped elements such as is illustrated in FIG. 3 in combination with variable reactances coupled to ports 65 and 66 of the quadrature-hybrid network to provide a phase shifter. The parallel capacitances which are normally coupled to ports 65 and 66 of the quadrature-hybrid network can be included, fully or partially, as a part of the capacitance of the variable reactances. The result is that a larger phase shift can be realized with a smaller range of varactor capacitance ($C_{max}/C_{min}$) as illustrated in FIG. 6.

The new improved analog phase shifter illustrated in FIG. 4 comprises four inductors 53, 54, 55 and 56 connected in series to form a ring. A first port 51 is coupled to one end of inductor 53 and a second port 52 is coupled to the other end of inductor 53. A first corner capacitor 57 is coupled between a ground terminal and the junction of inductor 53 with inductor 54; and, a second corner capacitor 58 is coupled between the ground terminal and the junction of inductor 53 with inductor 56. The junction of inductors 54 and 55 is coupled to a ground terminal through a varactor 59 in series with an inductor 60; and, the junction of inductors 55 and 56 is coupled to a ground terminal through a varactor 61 in series with an inductor 62. A control potential is applied to the phase shifter through a decoupling network 63 to control the capacitance of said varactors 59 and 61. The inductors 54 and 56 can have a value of $$L = \frac{Z_o/\sqrt{2}}{2\pi f_o}; \text{ and}$$

the inductors 53 and 55 can have a value of $$L = \frac{Z_o}{2\pi f_o},$$

where
$Z_o$ = input and output impedance of phase shifter
$f_o$ = desired center frequency.
The value of capacitors 57 and 58, which are similar, can be $$C = \frac{1}{Z_o 2\pi f_o} + \frac{1}{\frac{Z_o}{\sqrt{2}} 2\pi f_o}$$

An analysis of the circuit of FIG. 4 suggests an explanation of why, by absorbing the corner capacitances which are normally present at ports 65 and 66 of the quadrature-hybrid circuit into the varactor part of the network results in a larger phase shift than is obtained with the same ratio of varactor capacitances.

With the distributed element branch line coupler, the phase shift is $$\text{Arg}(j\Gamma_v)$$

where $$\Gamma_v = \frac{Z_v - Z_o}{Z_v + Z_o}$$

$Z_v$ = Varactor network impedance.

Now, normalizing all impedances to $Z_o$ and considering a varactor network that is totally reactive, the phase shift angle between ports 1 and 2 is $$\text{Arg}(S_{21}) = \text{Arg}(j\Gamma_v) = \text{Arg}\left[j\frac{jX_{vn} - 1}{jX_{vn} + 1}\right]$$

where $X_{vn}$ is the normalized reactance of the varactor network. This function is illustrated in FIG. 5.

By absorbing the corner capacitances at ports 65 and 66 into the varactor network, the portion of the reactance used for the phase shift is $$X_{used} = \frac{-1}{B_{used}} = \frac{-1}{\frac{-1}{X_{vn}} + 1 + \sqrt{2}}$$

because $(1+\sqrt{2})$ is that part of the susceptance which is required for the hybrid junction. The phase shift, then, will be given by the expression $$\text{Arg}(S_{21}) = \text{Arg}\left[j\frac{jX_{used} - 1}{jX_{used} + 1}\right]$$

FIG. 6 shows this expression as a function of $X_{vn}$. It is readily seen that a much larger phase shift is achieved for a small change in $X_{vn}$.

In addition, the range of $X_{vn}$ that gives the bulk of the phase shift has moved away from the zero crossing toward negative $X_{vn}$. This means that a larger capacitance varactor can be used with a smaller inductor, or without an inductor, while obtaining the same phase shift.

The advantages of the lumped element phase shifter here disclosed are as follows: The traditional prior art phase shifter requires quarter-wavelength transmission lines. The phase shifter here disclosed can use lumped elements which results in a smaller size. This is most dramatic at frequencies below 2 GHz. In addition, the phase shift range for a given change in variable reactance is substantially greater. While this improvement requires close matching of the two variable reactances, it will often allow the use of a less expensive abrupt junction varactor in place of an expensive hyper abrupt. Still further, the new phase shifter provides flexibility. Some of the capacitance which is removed from the lumped element quadrature-hybrid portion, of the phase shifter network, of FIG. 4 can be added back to provide a linear phase shift with voltage and/or to increase the tolerance to diode mismatch. This may, however, result in a reduction of range. The new phase shifter here disclosed permits the use of more realizable element values. The table below compares the values of elements required for a prior art phase shifter and three typical phase shifters for 180° linear range using abrupt junction diodes (1.7 GHz).

|  | Varactor Capacitance at 4V Bias (pF) | Series Inductance (nH) | Parallel Fixed Capacitance added at varactor node (pF) |
| --- | --- | --- | --- |
| Phase Shift Prior Art Device | 1.5 | 10.8 | N/A |
| Phase Shift Invention | 9.8 | 0 | 0 |
|  | 4.4 | 1.4 | 1.9 |
|  | 2.7 | 3.7 | 2.8 |

From the table above, it is clear that the new phase shifter here disclosed provides a large degree of flexibility. The series inductance of 10.8 nH in the prior art design may be difficult to realize at 1.7 GHz due to parasitic capacitance. Additionally, the higher capacitance varactors in the inventive design makes the network less sensitive to parasitic capacitance in the diode package. The new phase shifter offers many alternatives.

Smaller inductances would be required in the prior art design if a hyper abrupt diode is used, but they are more expensive, have poorly matched characteristics from one diode to the next, and have lower Q factors. The lower Q in this frequency range normally requires the use of Gallium Arsenide instead of silicon to raise the Q. This further increases the cost.

I claim:

1. A phase shifter comprising
first, second, third and fourth inductors coupled together in series relationship to form a ring,
said first inductor interposed between a first port and a second port,
a first capacitor interposed between the junction of said first and second inductors and a ground terminal,
a second capacitor interposed between the junction of said first and fourth inductors and a ground terminal,
a third capacitor interposed between the junction of said second and third inductors and a ground terminal, a fourth capacitor interposed between the junction of said third and fourth inductors and a ground terminal,
said third and fourth capacitors have a value which is different from that of said first and second capacitors,
a first varactor interposed between a ground terminal and the junction of said second and third inductors,
a second varactor interposed between a ground terminal and the junction of said third and fourth inductors, and
control means coupled to selectively control the capacitance of said first and second varactors.

2. The phase shifter of claim 1 wherein said third and fourth capacitors have a value of substantially zero.

3. The phase shifter of claim 2 wherein said control means comprises means to controllably apply a potential to said first and second varactors.

4. The phase shifter of claim 3 further including a fifth inductor coupled in series with said first varactor; and a sixth inductor coupled in series with said second varactor.

5. The phase shifter of claim 4 wherein said first and third inductors have similar values and said second and fourth inductors have similar values.

6. The phase shifter of claim 5 wherein said first and second capacitors have values which are similar.

7. The phase shifter of claim 6 wherein the change of capacitance of said first varactor relative to said potential is substantially equal to the change of capacitance of said second varactor relative to said potential.

8. The phase shifter of claim 7 wherein said first and third inductors each have a value of $$\frac{Z_o/\sqrt{2}}{2\pi f_o};$$

said second and fourth inductors each have a value of $$\frac{Z_o}{2\pi f_o};$$

said first and second capacitors each have a value of $$\frac{1}{Z_o 2\pi f_o} + \frac{1}{\frac{Z_o}{\sqrt{2}} 2\pi f_o}$$

where
$Z_o$ = input and output impedance.
$f_o$ = center frequency.

* * * * *

UNITED STATES PATENT AND TRADEMARK OFFICE
CERTIFICATE OF CORRECTION

PATENT NO.: 5,028,892

DATED: July 2, 1991

INVENTOR(S): Timothy E. Daughters

It is certified that error appears in the above-identified patent and that said Letters Patent is hereby corrected as shown below:

Column 3, line 21, "minimum capacitance" should read -- maximum capacitance --.

Signed and Sealed this

Twenty-first Day of September, 1993

Attest:

BRUCE LEHMAN

Attesting Officer     Commissioner of Patents and Trademarks